(12) United States Patent
Goldstein

(10) Patent No.: US 9,246,433 B2
(45) Date of Patent: Jan. 26, 2016

(54) AIRBORNE PHOTOVOLTAIC SOLAR DEVICE AND METHOD

(71) Applicant: Leonid Goldstein, Austin, TX (US)

(72) Inventor: Leonid Goldstein, Austin, TX (US)

( * ) Notice: Subject to any disclaimer, the term of this patent is extended or adjusted under 35 U.S.C. 154(b) by 0 days.

(21) Appl. No.: 14/533,280

(22) Filed: Nov. 5, 2014

(65) Prior Publication Data

US 2015/0053255 A1    Feb. 26, 2015

Related U.S. Application Data

(63) Continuation of application No. PCT/US2013/040666, filed on May 10, 2013.

(60) Provisional application No. 61/646,316, filed on May 13, 2012, provisional application No. 61/683,783, filed on Aug. 16, 2012, provisional application No. 61/706,123, filed on Sep. 27, 2012.

(51) Int. Cl.
| | |
|---|---|
| *H01L 31/02* | (2006.01) |
| *H01L 31/04* | (2014.01) |
| *H01L 31/054* | (2014.01) |
| *F24J 2/14* | (2006.01) |
| *F24J 2/52* | (2006.01) |
| *F24J 2/54* | (2006.01) |
| *B64B 1/50* | (2006.01) |
| *B64C 27/32* | (2006.01) |
| *B64C 31/00* | (2006.01) |
| *B64D 27/24* | (2006.01) |
| *H01L 31/042* | (2014.01) |
| *H01L 31/052* | (2014.01) |
| *F24J 2/07* | (2006.01) |

(52) U.S. Cl.
CPC . *H02S 10/00* (2013.01); *B64B 1/50* (2013.01); *B64C 27/32* (2013.01); *B64C 31/00* (2013.01); *B64D 27/24* (2013.01); *F24J 2/145* (2013.01); *F24J 2/5241* (2013.01); *F24J 2/5271* (2013.01); *F24J 2/541* (2013.01); *H01L 31/0422* (2013.01); *H01L 31/0525* (2013.01); *H01L 31/0547* (2014.12); *F24J 2002/075* (2013.01); *Y02E 10/52* (2013.01)

(58) Field of Classification Search
CPC ............ H01L 31/0547; H01L 31/0422; H01L 31/0525; F24J 2/5241; F24J 2/5271; F24J 2/541; H02S 10/00
USPC ....................................................... 136/246
See application file for complete search history.

(56) References Cited

U.S. PATENT DOCUMENTS

| | | | |
|---|---|---|---|
| 4,581,897 | A | 4/1986 | Sankrithi |
| 6,150,995 | A * | 11/2000 | Gilger ........................... 343/915 |

(Continued)

FOREIGN PATENT DOCUMENTS

RU      2064085 C1    7/1996

OTHER PUBLICATIONS

Aglietti, Redi, Tatnall, Markvart, Harnessing High-Altitude Solar Power, IEEE Transactions on Energy Conversion, vol. 24, No. 2, Jun. 2009.

*Primary Examiner* — Jayne Mershon

(57) ABSTRACT

An airborne photovoltaic solar system, comprising a parabolic reflector-concentrator (110, 1210), spread by wind, a solar panel (102, 1202) raised to high altitude using at least one lighter than air balloon (103, 1201), tracking the sun using aerodynamic surfaces and/or changes in buoyancy, relying on wind and/or cold air to cool the solar panel in one embodiment, as well as related methods and variations and alternatives.

17 Claims, 9 Drawing Sheets

(56) References Cited

U.S. PATENT DOCUMENTS

| | | | |
|---|---|---|---|
| 7,642,450 B2 * | 1/2010 | Connor | 136/246 |
| 7,997,532 B2 | 8/2011 | Tillotson | |
| 8,006,933 B2 | 8/2011 | Tillotson | |
| 2009/0230236 A1 * | 9/2009 | Tillotson | 244/30 |
| 2011/0233325 A1 * | 9/2011 | Kramer | 244/30 |
| 2013/0112237 A1 * | 5/2013 | Almogy et al. | 136/246 |

* cited by examiner

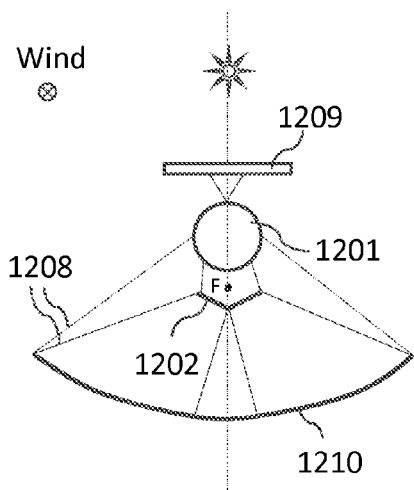
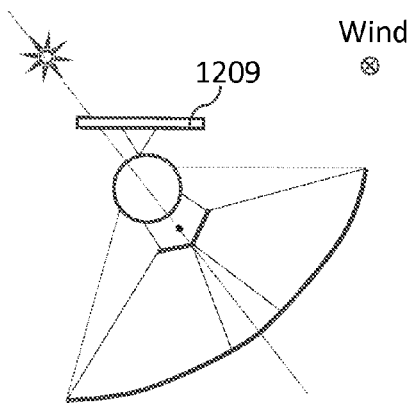
Fig. 13A    Fig. 13B
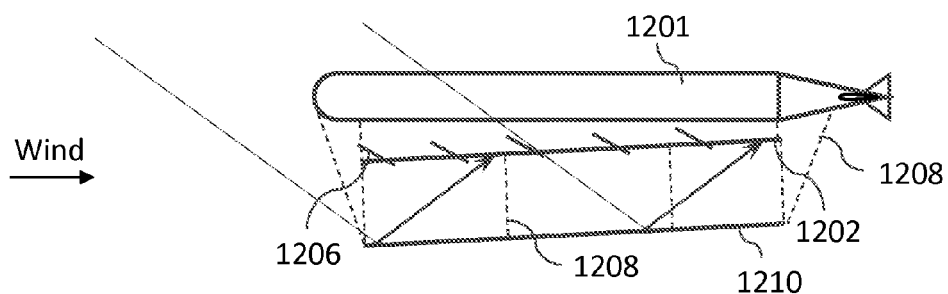
Fig. 13C
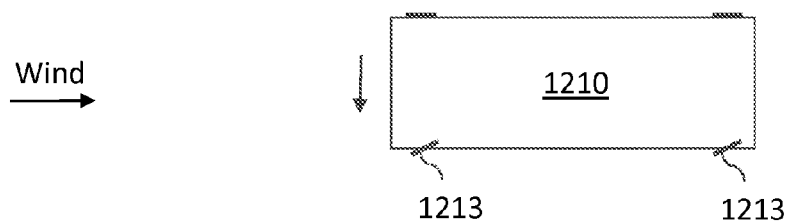
Fig. 14

AIRBORNE PHOTOVOLTAIC SOLAR DEVICE AND METHOD

CROSS REFERENCE TO RELATED APPLICATIONS

This Application is a continuation of PCT Application No. PCT/US13/40666, filed 10 May 2013, which claims the benefit of U.S. Provisional Applications No. 61/646,316, filed 13 May 2012, No. 61/683,783, filed 16 Aug. 2012, and No. 61/706,123, filed 27 Sep. 2012 by the same inventor as herein, the entire disclosure of which is incorporated herein by reference.

BACKGROUND OF THE INVENTION

Airborne photovoltaic solar panels are used as the power source in some unmanned planes, such as NASA Pathfinder and QinetiQ Zephir. An idea of an airborne photovoltaic solar device, transmitting energy to the ground over a power cable was proposed by a team consisting of Aglietti, Redi, Tatnall and Markvart (*Aglietti, Redi, Tatnall and Markvart, Harnessing High-Altitude Solar Power, IEEE Transactions on Energy Conversion*, Vol. 24, No. 2, June 2009.) In it, solar cells are patched to a surface of an aerostat on one side, and this patch is turned toward the sun at all times. This provides an advantage in the amount of light hitting the surface of the cells compared with the ground solar installation. Nevertheless, the advantage is negated by the costs of the aerostat.

Another airborne photovoltaic solar system is discussed in the U.S. Pat. No. 7,997,532 by Tillotson. It uses a solar panel, suspended from an airborne balloon. Nevertheless, it is still not attractive economically because it requires relatively large area of solar cells, which are expensive.

Currently, solar energy is not cost competitive with fossil fuels or even with wind energy, even in the south of the US. There is need in a cost effective photovoltaic solar energy system. This invention is directed to teaching such a system.

SUMMARY OF THE INVENTION

The invention is generally directed toward airborne solar energy conversion and related technology.

One embodiment of the invention is a system for converting solar energy into electric energy, comprising: at least one airborne platform; a solar panel, comprising multiple solar cells, attached to the airborne platform; a reflector, focusing solar radiation on the solar panel; an actuator for rotating the reflector; a power cable, connecting the solar panel to an electric grid or an electricity consumer on the ground; an electronic control system.

Examples of the airborne platform include: a lighter than air moored balloon; a wing or a system of wings, creating aerodynamic lift using wind; a wing or a system of wings, creating aerodynamic lift using wind by moving cross wind; a kytoon; a rotor with blades, powered by electric energy, generated by the solar panel. The rotor might be similar to a helicopter rotor, driven by an electric engine.

The reflector can be airborne as well. The reflector can be made of thin fabric, having reflective coating on one side. The reflector can receive and/or maintain its form by the wind pressure. An inverter-transformer can be installed in proximity to the solar panel and connected to the power cable. The power cable can be optionally attached to a second airborne platform, connected to the first airborne platform by another cable. The actuators for rotating solar panel can take form of aerodynamic surfaces, attached to the airborne platform and controlled automatically in response to apparent movement of the sun and/or changes in the direction of the wind and/or changes in the force of the wind and/or motion of the platform. The gas inside of the balloon or the kytoon can be any of the following: hydrogen, methane, helium, hot air or their combinations and mixes with other gases. A system, described above, can be elevated to sufficient altitude and controlled in such a way, that some combination of the following is true: i) cold air and natural winds at the altitude cool down the solar cells; ii) the solar panel is above clouds most of the time; iii) the solar panel is above substantial part of atmosphere, thus reducing solar radiation reflection, diffusion and absorption by the atmosphere; iv) the solar panel is above flying sand and debris and surface induced turbulence. The solar panel and the reflector may be placed at altitude of 3,000 meters above sea level or higher, which satisfies to large degree the conditions i-iv) in most geographic locations.

Another embodiment is a method of converting solar energy into electric energy, comprising steps: elevating a solar panel, comprising multiple solar cells, above the ground, using either buoyancy or aerodynamic lift or both buoyancy and aerodynamic lift; focusing solar radiation on the solar panel; using either cold air or natural wind or both to cool down the solar cells; using the solar panel to convert solar radiation into electric energy; transmitting the electric energy to a ground based installation through a power cable.

Further, an airborne reflector can be used for focusing solar radiation on the solar panel. The airborne reflector can be rotated to follow apparent sun motion. The position of the airborne reflector can be optimized to minimize wind drag. The position of the solar panel can be optimized to minimize wind drag. The solar panel and the reflector can be rotated in one or more of the following ways: to track the sun in order to direct maximum or optimum radiation at the solar panel; to follow the wind in order to minimize aerodynamic drag; to follow the wind in order to ensure sufficient aerodynamic forces to keep the reflector inflated and/or solar panel airborne; to direct maximum radiation at the solar panel while ensuring that aerodynamic drag and aerodynamic lift are within pre-defined limits. The solar panel is preferably placed in the focus of the reflector.

Another embodiment of the invention is a device for converting solar energy into electric energy, comprising: a lighter than air balloon; a solar panel, comprising multiple solar cells, attached to the balloon; a reflector-concentrator, attached to the balloon; an electric cable, connecting the solar panel to an electric grid or an electricity consumer on the ground; an electronic control system.

In the various embodiments of this invention it is suggested to take into account not only solar radiation, but also the wind, that is almost always present at an altitude. Moreover, methods are provided to use benefits, provided by the wind while avoiding its dangers.

Various objects, features, aspects, and advantages of the present invention will become more apparent from the following detailed description of preferred embodiments of the invention, along with the accompanying drawings in which like numerals represent like components.

BRIEF DESCRIPTION OF THE DRAWINGS

The accompanying drawings illustrate the invention. The illustrations omit details not necessary for understanding of the invention, or obvious to one skilled in the art, and show parts out of proportion for clarity. In such drawings:

FIG. 13A is a sectional view of some details of this embodiment in the plane YZ, when the sun is in zenith.

FIG. 13B is the previous view, when the sun is not in zenith.

FIG. 13C is a sectional view of some details of this embodiment in the plane XZ.

FIG. 14 is a top schematic view of the reflector-concentrator in this embodiment.

GLOSSARY

The term 'solar panel', as used here, includes 'solar array'.

Kytoon—a lift creating device, combining lift of lighter than air gas, with an aerodynamic lift in presence of wind. Preferably, kytoon comprises a balloon with a surface, generating at least a part of the useful lift.

Words 'reflector', 'concentrator' and 'reflector-concentrator' are used interchangeably and mean reflector-concentrator.

DETAILED DESCRIPTION OF THE PREFERRED EMBODIMENTS

Figure 1:
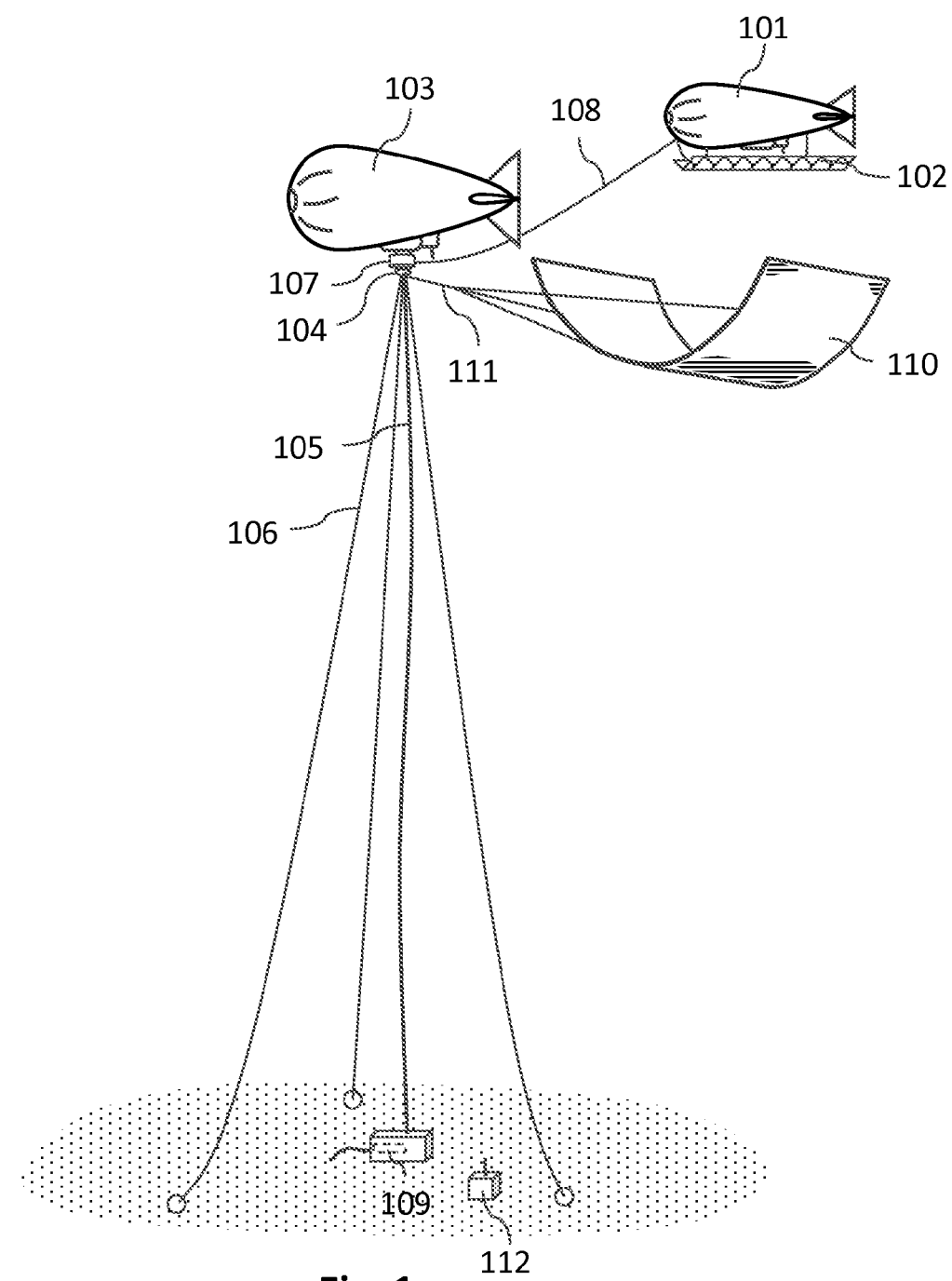
FIG. 1 is a schematic view of one embodiment of an airborne solar system, showing two balloons, a reflector-concentrator and ground installations and attachments.

FIG. 1 shows general view of one embodiment of the invention. There is a balloon 101, carrying a solar panel 102. There is another balloon 103, carrying a mount 104, which carries weight of an aluminum cable 105 and of three tethers 106 that attach balloon 103 to the ground and keep it in a fixed position in any wind. Tethers 106 are anchored at the ground in the vertices of an equilateral triangle. Tethers 106 are made of strong and light synthetic fibers, such as aramids, para-aramids or ultra-high molecular density polyethylene. Balloons 101 and/or 103 can have streamlined form to decrease wind forces, acting on them. An inverter-transformer 107 can be attached to mount 104. Cable 108 connects balloon 101 to the top of cable 105. Cable 108 comprises an aluminum conductor that conducts current from solar panel 102 to cable 105. Cable 105 is attached to ground electrical infrastructure element 109, which distributes electricity to ultimate consumers. Ground infrastructure element 109 can include an inverter, converting DC current, generated by the solar cells, into AC current, suitable for feeding into a grid (in absence of airborne inverter-transformer 107). Cable 108 also comprises a light but strong tether, made of synthetic fibers, and attached to mount 104. A large solar reflector-concentrator 110 soars in the air, attached to mount 104 by a cable 111. Reflector-concentrator 110 provides of its own lift or buoyancy, compensating most or all of its weight. It also has its own stabilization and control surfaces, allowing control system 112 to slowly change its orientation in the air along two axis. Balloon 101 also possess stabilization and control means. These control means allow control system 112 to slowly change it position in the space within maximum reach of cable 108 and to change angles of solar panel 102 to the horizontal plane. Reflector-concentrator (or simply concentrator) 110 has reflecting upper surface and reflects solar radiation and concentrates it on solar panel 102. Concentration ratios can be 10-1000 times. Concentrator 110 is straight downwind from mount 104 and balloon 103, balloon 101 is within the downwind hemisphere; cable 108 and cables 111 are attached in such way that they can move more than 360 degrees around mount 104, not fouling and unimpeded by balloon 103. Aluminum cable 105 can run along a mechanical cable, made of synthetic fibers, reinforcing it. Solar panel 102 is made conventionally: smaller solar modules or solar cells, connected both in series with diodes and in parallel. Solar panel 102 can be equipped with air flow augmenting surfaces, increasing air flow speed in the vicinity of the panel and creating turbulence, thus improving cooling. It can be also equipped with heat sinks. Heat conducting surfaces can be combined with air flow augmenting surfaces and/or turbulators in order to save mass.

Figure 2:
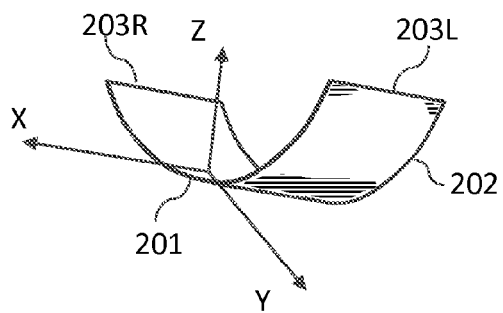
FIG. 2 shows the reflector-concentrator with a coordinate system.

Using FIG. 2, it is convenient to introduce axis: longitudinal axis X, lateral axis Y and normal axis Z. It is also convenient to designate the edge, closest to mount 104, as a leading edge 201, the opposite edge as a trailing edge 202, and two other edges as a left tip 203L and a right tip 203R. Leading edge 201 is always facing the wind. Length L of solar panel 102 approximately equals length (measured along axis X) of concentrator 110. The surface of concentrator 110 is a parabola in each cross section in the plane YZ, and it is a straight line in each cross section in the plane XZ; it can become slightly curved under force of wind in some variations.

The system is operated in the daylight according to the following algorithm:
  axis X of concentrator 110 is kept parallel or at small angle to the wind in order to minimize wind forces, acting on its surfaces (in some embodiments—also to provide some lift)
  concentrator 110 is rotated around axis X in such way, that its axis Z points to the projection of the sun onto plane YZ (the projection is parallel to axis X); for example, when the sun is in the zenith, axis Y is horizontal; the angle of axis Y can change from −85° to +85°, depending on the position of the sun and angle between the horizontal projection of the direction to the sun and wind direction
  there is a strip of approximately length L, parallel to axis X, into which concentrator 110 reflects the solar radiation that hits it; this strip is in the focus of the parabolic section of concentrator 110; balloon 101 is maneuvered to put solar panel 102 into this strip and to turn it perpendicular to the reflected sun beams. Thus, maximum solar energy is converted into electricity throughout a day and a year.

These are sample parameters of the system:

Voltage, DC: 10,000 V

Inverter-transformer 107: not used because DC current has sufficient voltage Altitude: 5,000 m Cable 105 sectional area: 10 cm$^2$ Total weight of cables 105 and 106: 15,000 kg Volume of balloon 103, hydrogen filled: 30,000-50,000 m$^3$ Reflecting area (perpendicular sunbeams): 500,000 m$^2$ (L×W, where L=250 m, W=2,000 m)

Height of the reflecting surface 110 (along axis Z): 350 m

Focus distance: f=W/2.83=700 m

Concentration ratio: 50:1

Solar panel area: 5,000 m$^2$ (250 m×40 m)

Solar cell efficiency: 15%

Peak output power: >100 MW

Required minimum wind speed: 2 m/s

The embodiment or embodiments, described above, have multiple advantages over ground based photovoltaic solar systems:

1) It allows to use much smaller amount of expensive solar cells and much smaller solar panels surface, compared with direct photovoltaics. Most of the expensive solar cells and supporting structures of solar panels are replaced by an inexpensive reflecting fabric, which is self-supporting in the presence of the wind. Further, efficiency of solar cells increases for concentrated light, allowing to produce more electricity.

2) It allows to cool the solar cells much more efficiently, because of the lower air temperature at the altitude and presence of the wind most of the time. In those rare times, when the wind becomes too slow, energy production may become less efficient. If wind's speed falls even lower, below a predefined threshold, the system can direct reflected light away from the solar panel, preventing it from damage by high temperature.

3) There is more energy in the solar radiation at the altitude, and larger part of it comes in the form of direct beams that can be efficiently concentrated (rather than diffused radiation, that cannot be concentrated). The concentrator and the solar panel can be also above most of the weather and clouds. Thus, this system can be deployed in the areas, where ground based systems are not efficient because of clouds or fog.

4) The system can track sun at lower angles, than the ground based tracking systems, and generate energy with lower losses at such time. This allows generating substantial power even in the high latitudes and throughout the whole day. This covers the late afternoon peak in the energy consumption, existing in many countries.

The system is least efficient, when the sun is very low and horizontal projection of the direction to the sun is close to the direction of the wind (or opposite to it).

Therefore, the location and altitude for such system should be preferably selected in such way, that this combination does not happen frequently. More solutions for this problem are proposed in the additional embodiments of this invention below.

5) Because the concentrator is above most of the weather, energy production is regular and predictable. This allows to overcome the problem of the intermittency, which plagues scalable renewable energy sources.

6) The solar panel and the solar concentrator are protected from sand, dust, flying debris, rain, wind gusts, vandalism and other harmful impacts, that exist on the ground. This allows to make it lighter and decreases need for periodic maintenance. Thus, solar concentrator's surface can be made almost entirely of a thin fabric, covered in a reflecting film (for example rip-stop nylon, covered with aluminum foil, or of metalized BoPET). Such airborne solar concentrator can be scaled to a very large size, which is impossible for ground based concentrators.

7) A single device, described above, would have negligible consequences for local climate. For a ground observer, it will have an effect of a single cloud, quickly passing in the sky. Nevertheless, a number of such devices, placed in proximity one to another, can be used for local climate improvement, such as creating an oasis in a desert. It is achieved because of decrease of direct solar irradiation, reaching ground. The density of such devices should decrease from the center to the periphery, in order to decrease effect of the temperature gradient near the ground, and resultant winds.

8) It should be noted that this system is not dependent on the wind in the same way as wind energy conversion device are, because it can operate at very low winds, which are almost always present. Because of its ability to operate in the winds, in which wind energy conversion devices cannot operate or have very low output, it is complementary to the wind energy.

Figure 3A:
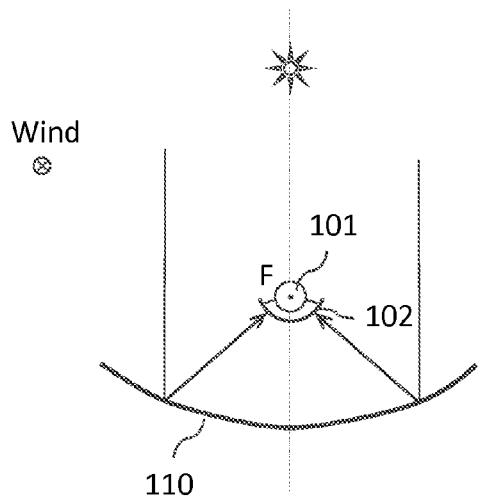
FIG. 3A is a sectional view of the reflector-concentrator and the solar panel in plane YZ when the sun is in zenith.

FIG. 3A shows sectional view of reflector-concentrator 110, solar panel 102 and balloon 101 in plane YZ, when the sun is in zenith. A property of a parabola is that it reflects light beams, parallel to its axis, into its focus F. Sectional form of solar panel 102 is a semi-circle with a center in the point F. Preferably, solar panel 102 completely shields balloon 101 from concentrated sun beams.

Figure 3B:
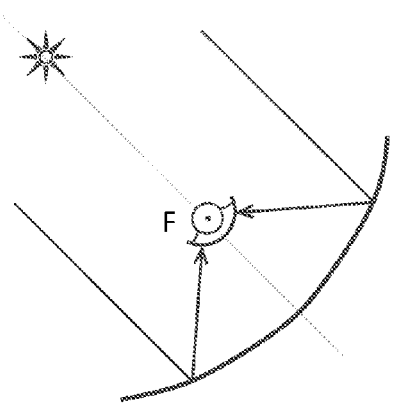
FIG. 3B is a view of the same, when the sun lower on the horizon.

FIG. 3B shows rotation of the subsystem, consisting of concentrator 110 and solar panel 102, when the sun is at the angle 45° to the horizon. This rotation can be achieved most easily by rotating concentrator 110 around its center of mass in plane YZ, shifting solar panel 102 sideways and down. Balloon 101 and solar panel 102 are rotated around their common center of mass. The direction of the wind is perpendicular to the viewed plane.

Figure 4:
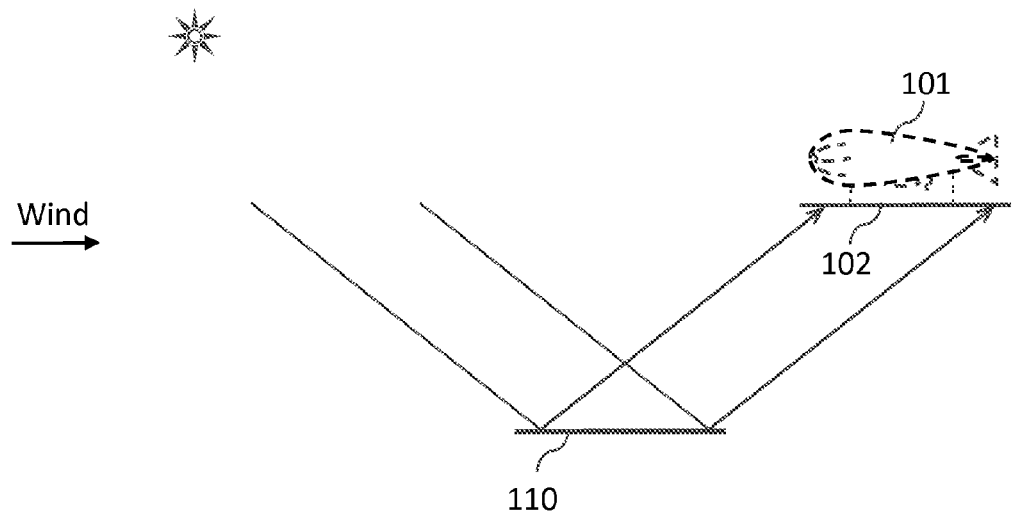
FIG. 4 is a cross sectional view of the reflector-concentrator and the solar panel in plane XZ.

FIG. 4 shows cross sectional view of the same details in plane XZ. It shows, how light beams bounce off the surface of concentrator 110 and hit solar panel 102. Horizontal position of balloon 101 with solar panel 102 can be adjusted by control system 112 to ensure precise hit.

Figure 5A:
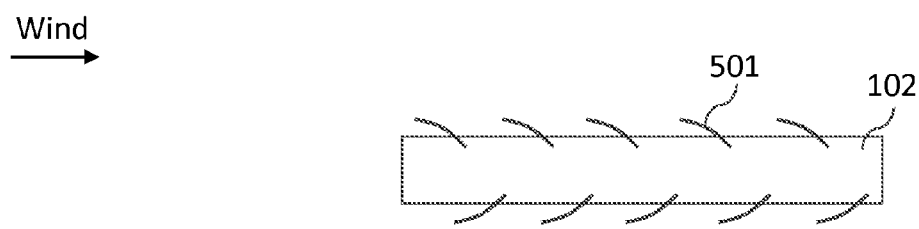
FIG. 5A is a view of the solar panel from below, showing flow augmentation diffusers.
Figure 5B:
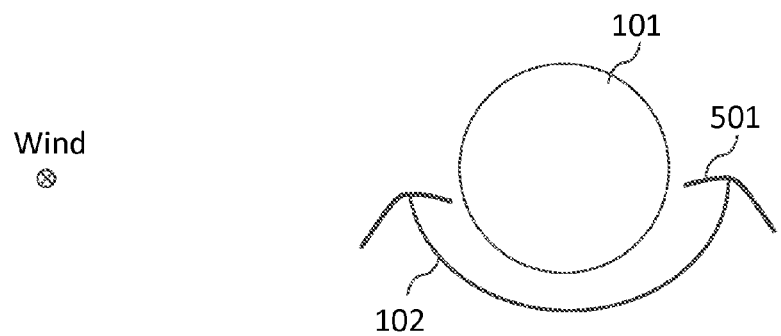
FIG. 5B is a cross sectional front view of the same.

FIG. 5A shows a view from below of solar panel 102 with air flow augmentation diffusers 501. These devices increase speed of air flow over both surfaces of solar panel 102 and create turbulence, increasing heat dissipation. FIG. 5B is one of a cross sectional views of the same.

Figure 6:
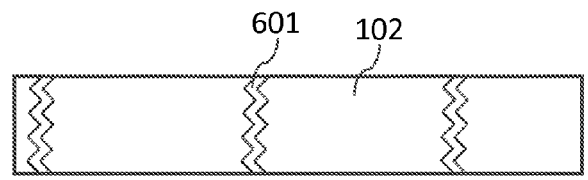
FIG. 6 is a view of turbulator strips on the surface of solar panel.

FIG. 6 shows solar panel 102 with turbulator strips 601 on its surface that create turbulence and increase heat dissipation.

Figure 7A:
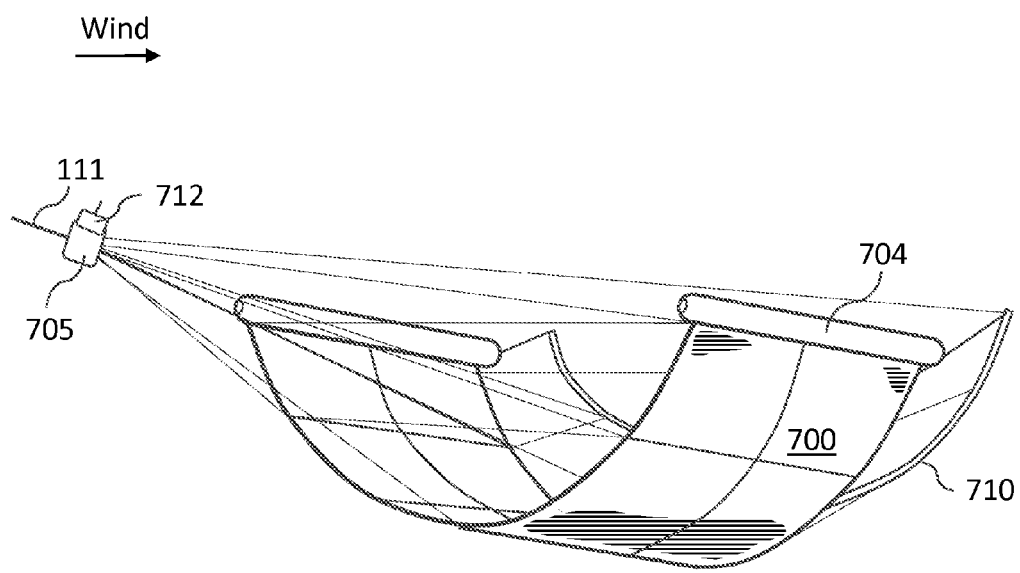
FIG. 7A is a perspective view of the reflector-concentrator.
Figure 7B:
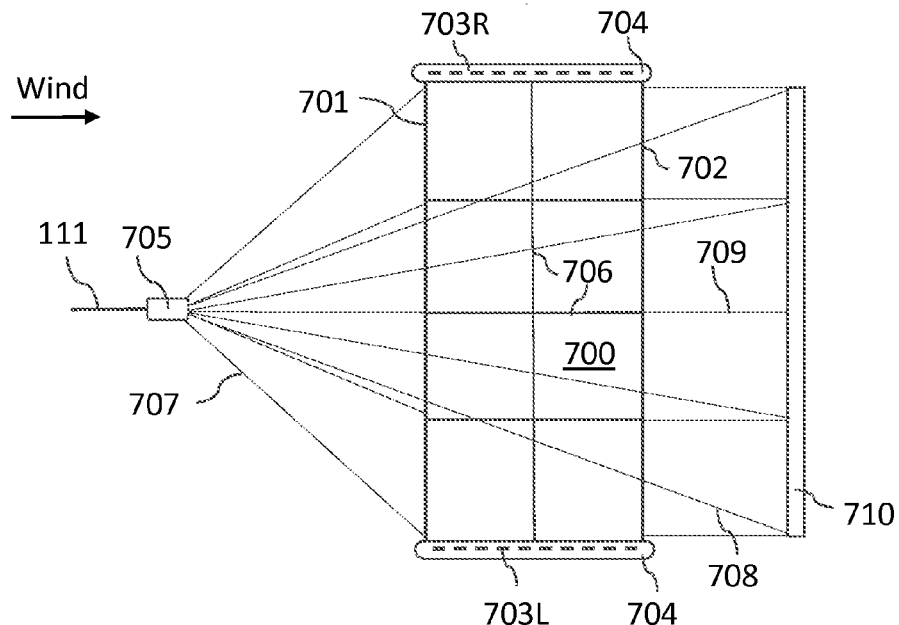
FIG. 7B is a projection of the reflector-concentrator into plane XY.
Figure 7C:
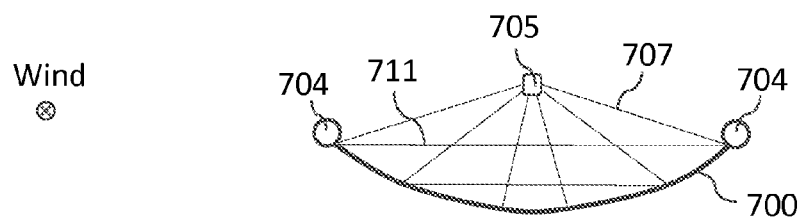
FIG. 7C is a projection of the reflector-concentrator into plane YZ.
Figure 7D:
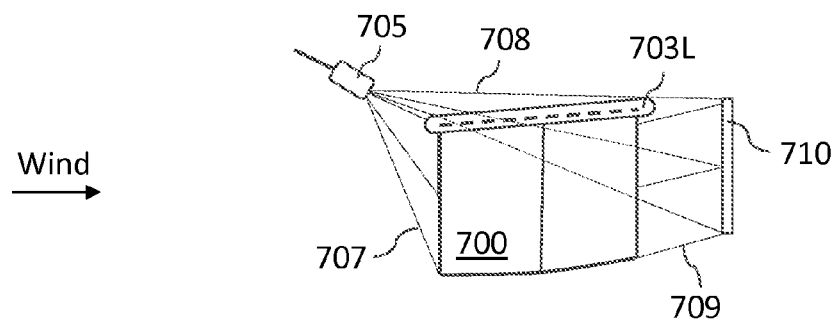
FIG. 7D is a projection of the reflector-concentrator into plane XZ.
Figure 7E:
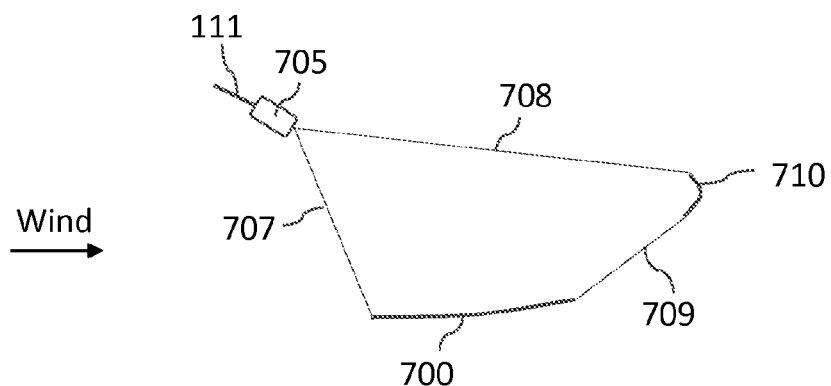
FIG. 7E is a sectional view the reflector-concentrator in plane XZ.

FIG. 7A-7E show one possible implementation of concentrator 110. FIG. 7A is a perspective view. FIG. 7B is the projection into plane XY; it shows most details. FIG. 7C is the projection into plane YZ. FIG. 7D is the projection into plane XZ. FIG. 7E is a sectional view in the plane XZ. FIG. 7C omits the stabilizer, and each figure omits some cables to decrease clutter.

Figure 8:
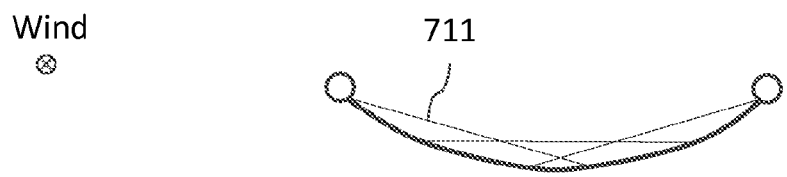
FIG. 8 is a schematic view of alternative cables arrangement in the reflector-concentrator in plane YZ.

Concentrator 110 comprises a large sheet 700 (that can be stitched from a number of smaller sheets) with reflecting upper surface, its leading edge is reinforced with a cable 701, its trailing edge is reinforced with a cable 702, its left and right edges are reinforced with cables 703L and 703R correspondingly. Cylindrical balloons 704 with lighter than air gas are attached to the left and the right edges of sheet 700 and create buoyancy, which keeps sheet 700 in the air under all conditions. Internally, sheet 700 can be reinforced by cables 706. There is a device 705, attached to cable 111 on one side and terminating front lines 707 and back lines 708. Front lines 707 are attached to the leading edge of sheet 700, while back lines 708 are attached to the trailing edge of a horizontal stabilizer 710, which is attached to the trailing edge of sheet 700 by multiple cables 709. Stabilizer 710 is implemented as a strip of synthetic fabric, which is much stronger than sheet 700. Control sub-system 712 is carried by device 705. Additionally, device 705 contains mechanisms to pull in and let out at least back lines 708. The trailing edge of sheet 700 is slightly higher than the leading edge, allowing the wind to inflate sheet 700, spreading its sides. In other words, axis X is slightly inclined to the horizontal plane; the angle increases in a weaker wind and decreases in a stronger one (by pulling in or letting out back lines 708). Lateral cables 711 (shown only in FIG. 7C) are connected at different heights and throughout the length of sheet 700 and ensure that sheet 700 keeps the form of parabola in the plane YZ. In this embodiment, sheet 700 is slightly curved, as shown in FIG. 7D, but the curvature is insignificant, and does not contribute much to the concentrating effect in this embodiment. It creates a negative lift along axis Z, which is compensated by pull of lines 707 and 708, and buoyancy of balloons 704. Balloons 704 are equipped with means to increase lift, decrease lift and keep the balloon at a defined altitude. FIG. 7E is a sectional view in the plane XZ. It shows the form of stabilizer 710, position of cables and joint form of sheet 700 and stabilizer 710. Surface of stabilizer 710 is non-reflective. In certain implementations there is a danger, that back lines 708 will hit lateral cables 711. To prevent this, an alternative arrangement of lateral cables 711 is shown in FIG. 8. Control sub-system 712 of control system 112 rotates sheet 700 in the plane YZ by commanding balloons 704 to increase or decrease their lift, and to stay at a defined altitude. Control sub-system 712 changes angle between axis X and direction of the wind by pulling in or letting out back lines 708.

Figure 9:
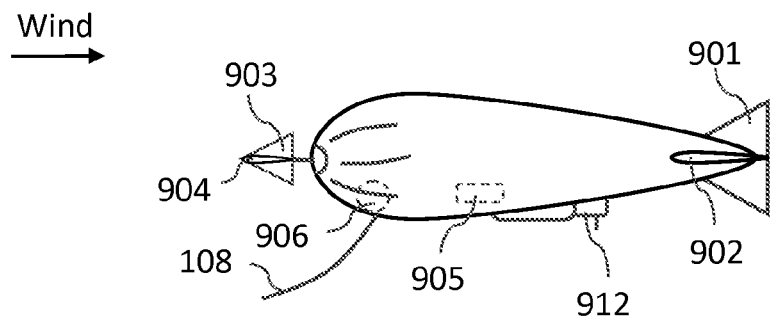
FIG. 9 shows details of the balloon, carrying the solar panel, in this embodiment.
Figure 10:
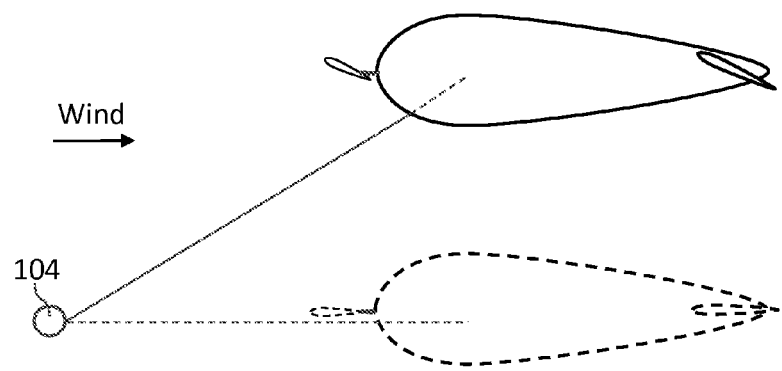
FIG. 10 is a top view of an example of a maneuver of the balloon in this embodiment.

FIG. 9 shows some details of balloon 101. It comprises a horizontal stabilizer-rudder 901 in the tail, a vertical stabilizer-elevator 902 in the tail, a horizontal rudder 903 in the nose, a vertical elevator 904 in the nose, a ballonet 905 for changing the buoyancy, a motorized pulley 906 for pulling in and letting out cable 108, optional counter-weights and a control sub-system 912. Employing aforementioned actuating devices in the presence of the wind, control sub-system 912 ensures that solar panel 102 stays in the focus of concentrator 110 and faces it straight. It should be noted, that direction of the wind can change, but balloon 101 and concentrator 110 change their positions with the wind, "following the wind", so their relative positions can be analyzed as if the wind direction does not change. FIG. 10 shows, how the tail and the nose rudders are used to move balloon 101 sideways in the horizontal plane (solid line—position of balloon 101, maintained by the deflected rudders). It should be noted, that there is always imprecision in the form of concentrator 110, so it reflects the sun radiation over the whole surface of solar panel 102, rather than at a single line.

Figure 11:
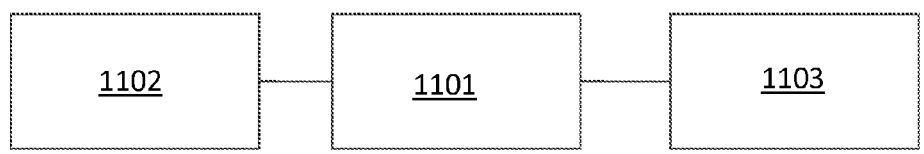
FIG. 11 is a scheme of a control system.

FIG. 11 shows an example control system 112, comprising processing logic 1101, plurality off sensors 1102 and plurality of actuators 1103. Typically, some elements of control system 112 are airborne and some are ground based, but the whole system can be airborne. Control system 112 directs and controls all aspects of the system operation, including sub-systems 712 and 912. It can comprise multiple sub-systems, attached to different parts of the construction. Control system 112 comprises one or more central processors or microcontrollers, sensors, communication means for communication between the sub-systems and with the outside world, and actuators. Possible communication means is a wireless network. The sensors may include anemometer, barometer, radar, hygrometer, thermometer, GPS, cable tension meter, cameras, light sensors, pressure sensors, altitude meters and other. Control system 112 can be connected to the Internet to receive general weather information, especially warnings of extreme weather events.

In more embodiments, cable 105 can be supported by more than one set of tethers 106 and balloons 103 at different altitudes. The reflecting surface of concentrator 110 can be covered by a substance, transparent for light waves in the length diapasons that can be absorbed and converted to electricity by solar cells, and diffusing or absorbing other light. This would allow to further decrease heating of solar panel 102. Balloon 101 can carry fans that would create air flow over the surface of solar panel 102, when there is no sufficient wind. Fans would work from electricity, generated by the solar panel itself. Balloon 101 can also employ propellers, driven by electric motors, to adjust its position in the space. Multiple concentrators 110 can be used with a single solar panel 102. Kytoons can be used in place of balloons 101 and/or 103. In other embodiments, sheet 700 can be stretched inside of a rigid frame, consisting of tubular members, used instead of cables 701, 702, 703R and 703L. These members can be made of fiberglass or carbon fiber. In a variation of this embodiment, only rigid members are in the leading and the trailing edges. Sheet 700 is kept stretched by the drag of stabilizer 710. In more embodiments, sheet 700 is perforated in order to minimize local pressure differences on two sides of the sheet and decrease wear. In more embodiments, a double sheet is used instead of single sheet 700. The space between the sheets is divided into cells, like in a foil kite, and the cells are inflated by the ram air. Such arrangement can be more durable, than a single sheet. In a variation of this embodiment, the cells are closed and inflated by lighter than air gas, eliminating need in balloons 704. In more embodiments, concentrator 110 can have a form of elliptical paraboloid with ellipse's longer axis along axis X and the shorter axis along axis Y. In another embodiment, the angle of axis Y to the horizon can be changed by a leap to 45° degrees or more, skipping the range of angles in which sheet 700 would experience high aerodynamic lift from the wind, and jumping into the range of lower drag forces. This is especially effective, when the sun is low and the wind is blowing from the direction of the sun. When the wind is weak, the angle of axis Y can be changed gradually through all the range. Further, in some embodiments, solar panel 102 can be fixed in the focus of concentrator, being rigidly fastened to its frame. A single balloon will carry the whole construction. Tracking will be achieved using aerodynamic forces, developed by concentrator 110 in the wind. The frame of concentrator 110 can be equipped with aerodynamic control surfaces, helping it to change angle to receive lift from the wind. In more embodiments, concentrator 110 can be sharded, and this allows almost arbitrary large scale shape of concentrator 110.

Figure 12:
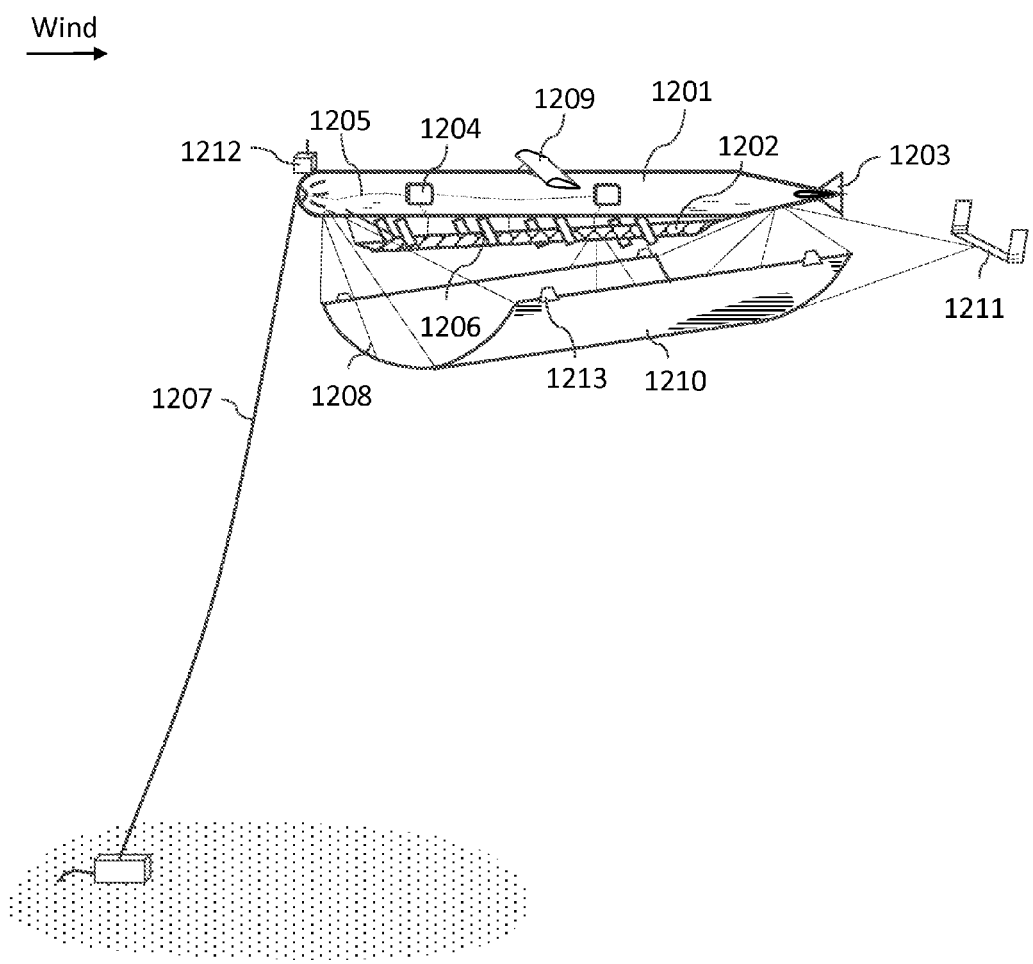
FIG. 12 is a perspective view of another embodiment of the invention, in which a single balloon carries both a solar panel and the reflector-concentrator.

FIG. 12 shows a general view of another embodiment of the invention. There is an elongated balloon 1201, filled with hydrogen or another lighter than air gas, carrying a solar panel 1202 attached on cables. Solar panel 1202 comprises one or more solar modules. Balloon 1201 has a balloon empennage 1203, comprising a vertical stabilizer, a horizontal stabilizer, a rudder, elevators, or their functional equivalents. One or more power electronics blocks 1204 are attached to balloon

1201. A power electronics block 1204 contains a solar inverter DC-to-AC with maximum power point tracking means. Power electronics blocks 1204 also comprise one or more transformers, increasing voltage of the AC current in order to decrease losses caused by the wire resistivity. It should be noted that at lower temperature at the altitude the transformers can be cooled easier and may not require liquid cooling, allowing making the transformers lighter. Each inverter is electrically connected to one or more solar modules on panel 1202. The inverters are connected in series and/or in parallel by internal wires 1205. Tether 1207 is made of strong and light synthetic fibers with aluminum wires inside of it. Tether 1207 attaches balloon 1201 to the ground and delivers generated electric energy from the above mentioned transformer(s) to the ground infrastructure. Ground connection can comprise a converter from high frequency AC (that allows to make transformers, carried by balloon 1201, lighter) to grid standard 50-60 Hz. Multiple inclined slats 1206 are connected to solar panel 1202 and are used for increasing air flow around solar panel 1202 and for creating lift in the presence of wind. A large solar reflector-concentrator 1210 is carried by balloon 1201, attached by cables 1208 to solar panel 1202 and balloon 1201 itself. Reflector-concentrator (or simply concentrator) 1210 is made of a sheet of a flexible fabric, having light reflecting upper surface. Concentrator 1210 reflects solar radiation and concentrates it on solar panel 1202. Balloon 1201 can be equipped with an optional wing 1209, which can be ram air inflatable. Concentrator 1210 has approximately the same length or is slightly shorter than solar panel 1202, both are shorter than balloon 1201. Concentrator 1210 is equipped with an additional empennage 1211, having width and height, close to those of concentrator 1210. Empennage 1211 comprises at least a vertical and horizontal stabilizers and, optionally, a rudder, elevators, or their functional equivalents. Empennage 1211 can be ram air inflatable. Empennage 1211 is connected to the trailing edge of concentrator 1210 in multiple points of both the empennage and the concentrator (not shown on the picture to reduce clutter), and to balloon 1201 in at least one point. Empennage 1211 provides stability to concentrator 1210 and can be used to control it. Concentrator 1210 is also equipped with control surfaces 1213 along its left and right edges. There is a control system 1212, carried on balloon 1201, which controls all aspects of the system operation. Concentrator 1210 can be made of rip-stop nylon, covered with aluminum foil, or of metalized BoPET, among other options.

In many respects, construction and operation of this embodiment are similar to those of the embodiment in FIG. 1 (balloon 1201 is similar to balloon 101, panel 1202 is similar to panel 102, concentrator 1210 is similar to concentrator 110, control system 1212 is similar to control system 112).

Using a coordinate system, similar to one in FIG. 2, axis X of concentrator 1210 has a small angle of 2-5° to the wind, so that the wind "inflates" the fabric of concentrator 1210, giving it a form of a parabola in each section in the plane YZ. Because of small angle between the surface of concentrator 1210 and direction of the wind the wind pressure on concentrator 1210 is small, and the fabric can be made thin and light. Solar panel 1202 is parallel to the axis X of concentrator 1210.

FIG. 13A shows sectional view of some details of this embodiment in the plane YZ, when the sun is in zenith. Plurality of cables 1208 attaches concentrator 1210 to panel 1202 and balloon 1201. Lengths and distribution of cables 1208 are selected in such way, that concentrator 1210 has parabolic section with a focus in the point F slightly behind the face of panel 1202 (when concentrator 1210 is fully stretched by the wind). No buoyancy elements are used in concentrator 1210—it is fully supported by cables 1208. When angle of the sun on the horizon changes, the construction is rotated around wind vector (which is close to the axis X), so that direction to the sun remains parallel to the axis of the parabola, as shown in FIG. 13B. Angles of rotation are +/−90°. To achieve the rotation, control system 1212 determines desirable angle of the axis Z to the vertical and issues commands to the actuators of control surfaces 1213 and other movable control surfaces that may be present in empennage 1203 and/or empennage 1211 to change orientation of the system. It should be noted, that the fabric of concentrator 1210 can be very light, and aerodynamic forces, acting on it are balanced by aerodynamic forces, acting on panel 1202 and balloon 1201, so only a small force is required to turn the device in space. Balloon 1201 gets in the position with its long axis along the wind by the action of the wind, without need for active control. The long axis of balloon 1201 remains constantly aligned with the wind. If wing 1209 is present, its lateral axis remains horizontal and it creates vertical lift, as will be explained below. FIG. 13C shows sectional view of some details of this embodiment in the plane XZ. Besides these details, marked by their numbers, it shows reflection of the light beams in the plane XZ. When the sun is low and horizontal projection of direction to the sun is close to the wind vector (+/−180°), sun beams falls onto concentrator 1210 and reflect from it at low angles (FIG. 13C shows an angle of about 40°). This is why the lengths of concentrator 1210 and solar panel 1202 are significantly larger than the distance between them. Even at low angles, most of the light, falling on the concentrator 1210, is reflected onto the panel 1202. In this embodiment, the position of concentrator 1210 relative to panel 1202 is fixed. FIG. 13C also shows slats 1206. These slats 1206 are flat shields, made of fiberglass or aluminum, attached to solar panel 1202 and inclined at 15-45° to the horizon in the direction of axis X. They serve two functions: increase air flow around the solar panel, especially at its back side, and create aerodynamic lift in the positive direction of axis Z, which compensates negative lift, created by the surface of concentrator 1210. Unlike it, the aerodynamic lift by wing 1209 is usually directed upward, and serves to compensate downward force, resulting from the sum of drag, created by the wind, and pull by tether 1207. Wing 1209 is shown symbolically. Instead of it, three or more short wings can be attached in different points around circumference of vertical section of balloon 1201 and controlled in such a way, as to create upward lift. Also, wing 1209 can be omitted, in which case balloon 1201 will tend to descend to lower altitude in stronger winds, until forces of wind, buoyancy and pull of tether 1207 come into balance.

FIG. 14 is a schematic top view of concentrator 1210, showing work of control surfaces 1213. To move concentrator 1210 to one side, control system 1212 rotates control surfaces 1213 on that side, and the wind force causes movement to that side, as shown by an arrow near concentrator 1210. Control surfaces 1213 on the opposite edge remain parallel to the edge.

This embodiment has all the benefits of the embodiment in FIG. 1, while being simpler and better scalable down.

These are example parameters of the system:

Voltage, AC: 50,000 V
Power electronics 1204: 8×500 kW inverters and 1×4 MW transformer
Altitude: 6,000 m
Length of balloon 1201: 300 m
Diameter of balloon 1201: 15 m
Volume of balloon 1201: 45,000 m³
Airborne mass: up to 25,000 kg Reflecting area (perpendicular to sunbeams): 20,000 m² (L×W, where L=250 m, W=80 m)

Concentrator's Focus distance: f=40 m

Concentration ratio: 20:1

Solar panel area: 1,000 m² (250 m×4 m)

Solar modules in panel 1202: 8 units

Solar module efficiency: 15%

Peak output power (at 1.25 sun): 3.75 MW

Required minimum wind speed: 1 m/s

Additionally, a Fresnel prism can be installed in front of solar panel 1202, dispersing concentrated light from concentrator 1210. Then, two kinds of solar cells can be used, each for the part of spectrum, in which it is more effective. For example, polycrystalline silicon cells with bandgap 1.1 eV can be used in infrared and red parts of spectrum, and amorphous silicon cells with bandgap 1.7 eV can be used in the parts of spectrum with shorter wavelengths, including most of the visible light. Such system will have increased efficiency and lower parasitic heating, without using expensive multi junction cells. When the sun is low on the horizon, the wind blows from the direction of the sun and the wind is light, control system 1212 can increase angle between axis X and the wind from 2-5° to 15-30° and even 60°. This will increase amount of light, falling on concentrator 1210 and reflected onto solar panel 1202. For better stability, parts of concentrator 1210 can have holes in the fabric. In another embodiment, concentrator 1210 can taper toward its trailing edge. In other words, the further to the trailing edge the section in the plane YZ is take, the shorter focus distance of the parabola becomes in this embodiment. With such form, concentrator 1210 is kept inflated even when its axis X is parallel to the wind. In this embodiment, solar panel 1202 should be placed at angle to axis X, so that the solar panels remain near the focus over all its length. In more embodiments, solar panel 1202 and concentrator 1210 can be moved relative to one another along axis X in order to fully catch reflection from concentrator 1210 onto solar panel 1202. In other embodiments, inverters and transformers in power electronics blocks 1204 can be omitted. It should be also noted that the parabolic form of reflector-concentrator can be approximated by other curved surfaces.

Thus, an airborne photovoltaic solar device and system are described in conjunction with one or more specific embodiments. While above description contains many specificities, these should not be construed as limitations on the scope, but rather as exemplification of several embodiments thereof. Many other variations are possible and contemplated.

What is claimed is:

1. A system for converting solar energy into electric energy, comprising:
    at least one airborne platform;
    a solar panel, comprising multiple solar cells, attached to the airborne platform;
    a reflector-concentrator, focusing solar radiation on the solar panel;
    a first actuator for moving the solar panel in space independently of the reflector concentrator;
    a second actuator for rotating the reflector-concentrator;
    a power cable, connecting the solar panel to an electric grid or an electricity consumer on the ground.

2. The system of claim 1, further comprising an electronic control system.

3. The system of claim 1, wherein the airborne platform comprises a lighter than air moored balloon.

4. The system of claim 1, wherein the airborne platform comprises a surface, developing aerodynamic lift under impact of wind.

5. The system of claim 1, wherein the airborne platform comprises a kytoon.

6. The system of claim 1, wherein the airborne platform comprises a rotor with blades, powered by electrical energy, generated by the solar panel.

7. The system of claim 1, wherein the reflector-concentrator is airborne.

8. The system of claim 1, wherein the actuator is an aerodynamic surface, responsive to the control system.

9. The system of claim 1, wherein the reflector-concentrator is formed by fabric, having reflective coating on one side.

10. The system of claim 1, wherein the reflector-concentrator and the solar panel are at altitude of 3,000 meters above the sea level or higher.

11. The system of claim 1, wherein the reflector-concentrator maintains its form by the pressure of wind.

12. The system of claim 1, wherein the distance between centers of the reflector-concentrator and the solar panel is variable.

13. A method of converting solar energy into electric energy, comprising steps: elevating a solar panel, comprising multiple solar cells, above the ground, using either buoyancy or aerodynamic lift or both buoyancy and aerodynamic lift;
    focusing solar radiation on the solar panel with an airborne trough reflector-concentrator;
    keeping an axis of the airborne trough reflector-concentrator nearly aligned with the wind direction;
    using either ambient cold air or natural wind or both to cool down the solar cells;
    using the solar panel to convert solar radiation into electric energy;
    transmitting the electric energy to a ground based installation through a power cable.

14. The method of claim 13, wherein wind helps to maintain proper shape of the airborne reflector-concentrator.

15. The method of claim 13, further comprising a step of rotating the airborne reflector-concentrator following apparent sun motion.

16. The method of claim 13, wherein the position of the airborne reflector-concentrator is optimized to minimize wind drag.

17. The method of claim 13, wherein the position of the solar panel is optimized to minimize wind drag.

* * * * *